(12) United States Patent
Balakrishnan et al.

(10) Patent No.: US 7,313,190 B2
(45) Date of Patent: Dec. 25, 2007

(54) EFFICIENT BIT INTERLEAVER FOR A MULTI-BAND OFDM ULTRA-WIDEBAND SYSTEM

(75) Inventors: Jaiganesh Balakrishnan, Dallas, TX (US); Anuj Batra, Dallas, TX (US); Anand G. Dabak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 715 days.

(21) Appl. No.: 10/797,880

(22) Filed: Mar. 10, 2004

(65) Prior Publication Data

US 2004/0178934 A1    Sep. 16, 2004

Related U.S. Application Data

(60) Provisional application No. 60/453,871, filed on Mar. 11, 2003.

(51) Int. Cl.
*H04L 27/00* (2006.01)
(52) U.S. Cl. .................................. 375/260; 714/787
(58) Field of Classification Search ................ 375/260, 375/296, 285; 714/762, 787, 788
See application file for complete search history.

(56) References Cited

U.S. PATENT DOCUMENTS

| | | | |
|---|---|---|---|
| 6,680,931 B1* | 1/2004 | Aigasa et al. | 370/349 |
| 2001/0030939 A1* | 10/2001 | Vijayan et al. | 370/208 |
| 2002/0159532 A1* | 10/2002 | Wight | 375/260 |
| 2004/0076238 A1* | 4/2004 | Parker et al. | 375/260 |
| 2004/0151109 A1* | 8/2004 | Batra et al. | 370/208 |
| 2005/0135493 A1* | 6/2005 | Maltsev et al. | 375/260 |

* cited by examiner

*Primary Examiner*—Kevin Kim
(74) *Attorney, Agent, or Firm*—Steven A. Shaw; W. James Brady; Frederick J. Telecky, Jr.

(57) ABSTRACT

An efficient bit interleaving scheme for a multi-band OFDM ultra-wideband (UWB) system. The encoded bits of the multi-band OFDM system are interleaved within each OFDM symbol and across OFDM symbols. The bit interleaving scheme minimizes performance degradation due to groups of contiguous OFDM tones experiencing a poor SNR caused by the frequency selective channel, exploits the frequency diversity across sub-bands, randomizes the effect of co-channel interference from simultaneously operating un-coordinated piconets, and randomizes the impact of generic narrow-band interferers present within the UWB spectrum.

47 Claims, 3 Drawing Sheets

EFFICIENT BIT INTERLEAVER FOR A MULTI-BAND OFDM ULTRA-WIDEBAND SYSTEM

CLAIM TO PRIORITY OF PROVISIONAL APPLICATION

The application claims priority under 35 U.S.C. § 119(e)(1) of provisional application Ser. No. 60/453,871, entitled Efficient Bit Interleaver For A TFI-OFDM Ultra-Wideband System, filed Mar. 11, 2003, by Jaiganesh Balakrishnan, Anuj Batra and Anand Dabak.

BACKGROUND OF THE INVENTION

1. Field of the Invention

This invention relates generally to multiband systems for ultra wideband (UWB) applications, and more specifically to a technique for implementing efficient bit interleaving for a UWB system employing multi-band orthogonal frequency division multiplexing (OFDM).

2. Description of the Prior Art

The encoded bits in a multi-band OFDM system are grouped into OFDM symbols, and each symbol is transmitted over different frequency sub-bands. The UWB multi-path channel is frequency selective and exhibits significant gain (or attenuation) variations across tones and sub-bands. This results in unequal error protection for the encoded bits transmitted across the various tones and sub-bands.

In view of the above, it would be both advantageous and desirable to provide a bit interleaving scheme that minimizes performance degradation due to groups of contiguous OFDM tones experiencing a poor SNR caused by the frequency selective channel, exploits the frequency diversity across sub-bands, randomizes the effect of co-channel interference from simultaneously operating un-coordinated piconets, and randomizes the impact of generic narrow-band interferers present within the UWB spectrum.

SUMMARY OF THE INVENTION

The present invention is directed to an efficient bit interleaving scheme for a mult-band OFDM ultra-wideband (UWB) system. The encoded bits of the multi-band OFDM system are interleaved within each OFDM symbol and across OFDM symbols. The bit interleaving scheme minimizes performance degradation due to groups of contiguous OFDM tones experiencing a poor SNR caused by the frequency selective channel, exploits the frequency diversity across sub-bands, randomizes the effect of co-channel interference from simultaneously operating un-coordinated piconets, and randomizes the impact of generic narrow-band interferers present within the UWB spectrum.

According to one embodiment, a bit interleaving method comprises the steps of grouping the coded bits of an OFDM symbol stream into blocks of $XN_{CBPS}$, wherein X is a desired number of OFDM symbols and further wherein $N_{CBPS}$ is the number of coded bits per symbol;

permuting each group of coded bits and generating interleaved OFDM symbols in response thereto only if the coded bits available for grouping correspond to no less than X OFDM symbols;

grouping the interleaved OFDM symbols into blocks of $N_{CBPS}$ bits; and permuting each block of $N_{CBPS}$ bits associated with the interleaved OFDM symbols and generating interleaved OFDM tones in response thereto.

According to another embodiment, a bit interleaving method comprises the steps of grouping the coded bits of an OFDM symbol stream into blocks of $XN_{CBPS}$, wherein X is a desired number of OFDM symbols and further wherein $N_{CBPS}$ is the number of coded bits per symbol, and further wherein pad bits are added to increase the number of bits to correspond to $XN_{CBPS}$, whenever the number of coded bits per symbol is less than $N_{CBPS}$;

permuting each group of coded bits and generating interleaved OFDM symbols in response thereto;

grouping the interleaved OFDM symbols into blocks of $N_{CBPS}$ bits; and permuting each block of $N_{CBPS}$ bits associated with the interleaved OFDM symbols and generating interleaved OFDM tones in response thereto.

According to yet another embodiment, a bit interleaver comprises a symbol interleaver operational to group the coded bits of a an OFDM symbol stream into blocks of $XN_{CBPS}$ coded bits, wherein X is the desired number of OFDM symbols and further wherein $N_{CBPS}$ is the number of coded bits per symbol, and further operational to permute each group of coded bits and generate interleaved OFDM symbols in response thereto only if the coded bits available for grouping correspond to no less than X OFDM symbols; and A tone interleaver operational to group the interleaved OFDM symbols into blocks of $N_{CBPS}$ bits and permute each block of $N_{CBPS}$ bits associated with the interleaved OFDM symbols and generate interleaved OFDM tones in response thereto.

In cases where the number of bits is less than $XN_{CBPS}$, the symbol interleaver is skipped; and only a tone interleaving operation is performed. The foregoing symbol interleaving and tone interleaving operations can optionally be implemented with a single interleaving operation using a composite interleaver.

According to still another embodiment, a composite bit interleaver is operational to group the coded bits of an OFDM symbol stream into blocks of $XN_{CBPS}$ coded bits, wherein X is the desired number of OFDM symbols and further wherein $N_{CBPS}$ is the number of coded bits per symbol, and further operational to permute each group of coded bits and generate interleaved OFDM symbols in response thereto only if the coded bits available for grouping correspond to no less than X OFDM symbols; and further operational to group the interleaved OFDM symbols into blocks of $N_{CBPS}$ bits and permute each block of $N_{CBPS}$ bits associated with the interleaved OFDM symbols and generate interleaved OFDM tones in response thereto.

According to still another embodiment, a composite bit interleaver is operational to group the coded bits of an OFDM symbol stream into blocks of $XN_{CBPS}$ coded bits, wherein X is the desired number of OFDM symbols, $N_{CBPS}$ is the number of coded bits per symbol, and pad bits are used to increase the number of bits to correspond to X OFDM symbols whenever the number of coded bits per symbol is less than $N_{CBPS}$, and to permute each group of coded bits and generate interleaved OFDM symbols in response thereto; and further operational to group the interleaved OFDM symbols into blocks of $N_{CBPS}$ bits and permute each block of $N_{CBPS}$ bits associated with the interleaved OFDM symbols and generate interleaved OFDM tones in response thereto.

According to still another embodiment, a bit interleaving method comprises the steps of permuting coded bits of an OFDM symbol stream and generating interleaved OFDM symbols to implement a desired interleaved OFDM symbol pattern in response thereto; and permuting each group of bits associated with each interleaved OFDM symbol and generating interleaved OFDM tones within each OFDM symbol in response to the desired interleaved OFDM symbol pattern.

The foregoing step of permuting each group of bits associated with each interleaved OFDM symbol and generating interleaved OFDM tones within each OFDM symbol in response to the desired interleaved OFDM symbol pattern can be achieved via a plurality of different types of symbol/tone interleaving operations, for example, wherein each type of symbol/tone interleaving operation is determined via the desired interleaved OFDM symbol pattern. Thus, one could, for example, switch between two different types of interleavers every six OFDM symbols. In this instance, one embodiment of the symbol/tone interleaver could be employed for the first six OFDM symbols; while for the second six OFDM symbols, another (different) embodiment of the symbol/tone interleaver could be employed. The difference between the two interleaver structures could be as simple as doing a bit reversal between the two interleaver structures.

According to still another embodiment, a bit interleaving method comprises the steps of permuting coded bits of an OFDM symbol stream and generating interleaved OFDM symbols in response thereto; and permuting each group of bits associated with each interleaved OFDM symbol and generating interleaved OFDM tones within each OFDM symbol in response thereto.

'Pad bits' can be used to increase the number of bits to correspond to $XN_{CBPS}$ when the number of bits is less than $XN_{CBPS}$. The 'pad bits' can be added either at the input of the scrambler seen, for example, in FIG. 2, as a parallel stream to the input data, or at the input of the interleaver, for example, also seen in FIG. 2, as a parallel stream coming from the puncturer output. Theoretically, the pad bits can be any random binary sequence. Using a random binary sequence is desirable, especially when the pad bits are introduced at the input of the interleaver. If, however, the pad bits are introduced at the input of the scrambler, an 'all zero' sequence or and 'all one' sequence is sufficient. The foregoing process is easily implemented and the scrambler would randomize these bits such that the pad bits at the output of the scrambler correspond to a random binary sequence.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The efficient bit interleaving scheme described herein below may be implemented for a UWB system employing multi-band OFDM such as the one disclosed in U.S. patent application Ser. No. 10/688,169, entitled Time-Frequency Interleaved Orthogonal Frequency Division Multiplexing Ultra Wide Band Physical Layer, docket no. TI-35949, filed on Oct. 18, 2003 by Anuj Batra et al. Patent application Ser. No. 10/688,169 is incorporated in its entirety by reference herein.

Figure 1:
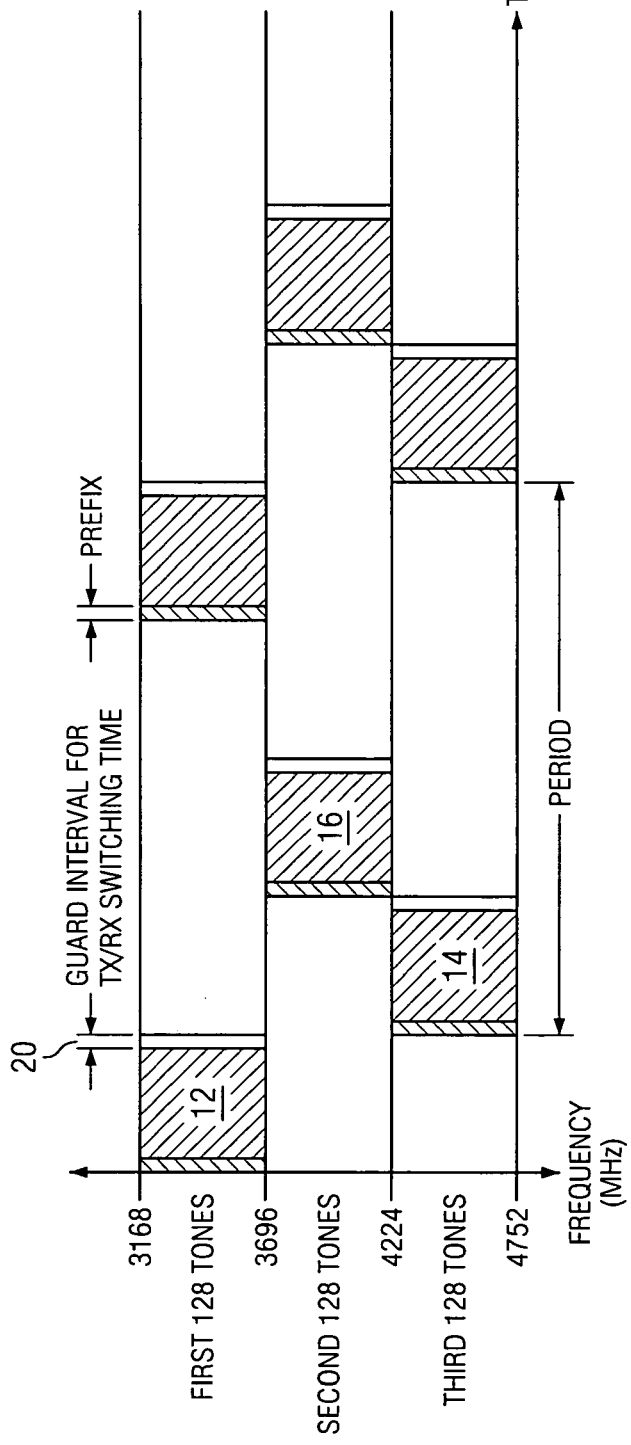
FIG. 1 is a time-domain representation of time-frequency coding for multi-band OFDM transmission.

In the foregoing UWB system, the OFDM symbols are coded across both time and frequency. An example of this time-frequency coding for multi-band OFDM transmission is shown in FIG. 1. In this representation 10, the first OFDM symbol 12 is transmitted on channel number 1, the second OFDM symbol 14 is transmitted on channel number 3, the third OFDM symbol 16 is transmitted on channel number 2, and so on. The exact time-frequency coding pattern may be different from packet to packet and piconet to piconet. From FIG. 1, one can see that a guard interval 20 is inserted after each OFDM symbol. This guard interval 20 ensures the transmitter and receiver have sufficient time to switch from the current channel to the next channel.

Figure 2:
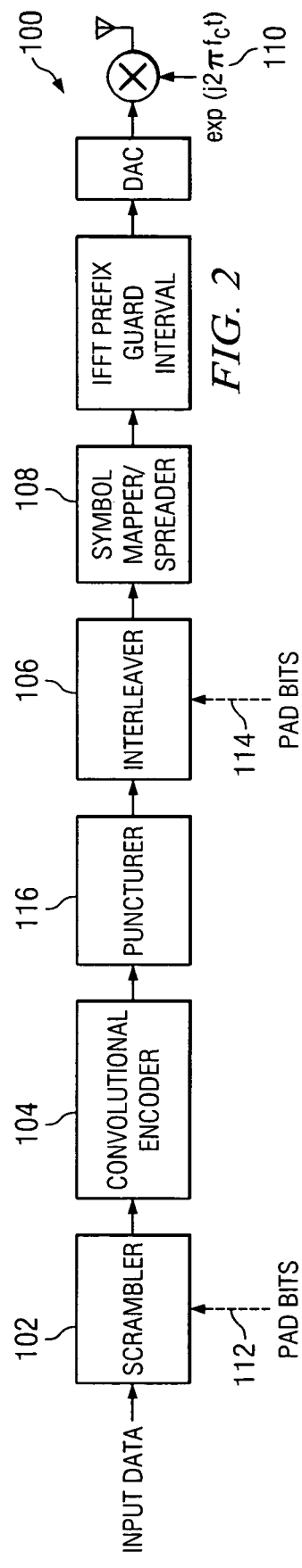
FIG. 2 is a simplified block diagram illustrating a typical transmitter architecture for a multi-band OFDM system.

One of the primary advantages of the multi-band OFDM system is the capability to exploit the frequency diversity across the various sub-channels. The design of the bit interleaving scheme is critical in exploiting the frequency diversity across the sub-channels. One typical transmitter architecture 100 for a multi-band OFDM system is illustrated in FIG. 2. The input bits are whitened using a scrambler 102, encoded using a convolutional code 104, interleaved 106, mapped onto an OFDM symbol 108, modulated into the appropriate sub-channel 110, and transmitted.

In cases where the number of bits is less than $XN_{CBPS}$, (where X is a desired integer value), as stated herein before, the symbol interleaver is skipped; and only a tone interleaving operation is performed. The foregoing symbol interleaving and tone interleaving operations can easily be implemented with a single interleaving operation using a composite interleaver.

Bit Interleaving

The salient features and advantages of the bit interleaving scheme are described herein below. The UWB multi-path channel is frequency selective and exhibits significant gain (or attenuation) variations across tone and sub-bands as stated herein before. This results in unequal error protection for the encoded bits transmitted across the various tone and sub-bands. The encoded bits of a multi-band OFDM system are interleaved within each OFDM symbol and across OFDM symbols in accordance with the scheme described herein. The bit interleaving operation is performed in two stages: symbol interleaving followed by tone interleaving.

In the first stage, the symbol interleaver permutes the encoded bits across OFDM symbols. The symbol interleaving provides the following advantages:

1) enables the multi-band OFDM system to obtain frequency diversity across the sub-bands. The average multi-path energy in each sub-channel (i.e. bandwidth 500 MHz) of typical UWB multi-path channel impulse responses exhibits shadowing with a standard deviation of approximately 3 dB;
2) randomizes the co-channel interference from simultaneously operating un-coordinated piconets. Depending on the time-frequency coding pattern that is employed, the co-channel interferer may be present in only a sub-set of the used sub-bands; and
3) randomizes any generic narrow-band interferers that are present within the UWB spectrum.

In the second stage, the output bits of the symbol interleaver are passed onto a tone interleaver. The tone interleaver permutes the bits across the data tones within an OFDM symbol. The tone interleaving operation provides the following advantages:

1) enables the multi-band OFDM system to achieve frequency diversity across tones. The UWB channel impulse response is frequency selective and results in significant gain (or attenuation) variations across the OFDM tones. Typically, a null in the frequency domain, introduced by the multi-path channel, affects a group of adjacent OFDM tones. The presence of a group of contiguous OFDM tones experiencing a poor SNR, due to the frequency-domain channel null, results in unequal error protection of the transmitted data bits and increases the performance degradation of the multi-band OFDM system. Tone interleaving mitigates this problem by randomizing the distribution of the bits transmitted on tones experiencing a poor SNR; and
2) randomizes the interference caused by generic narrow-band interferers present within the frequency band of the OFDM symbol. The narrow-band interferer affects a small set of contiguous tones and its impact on an OFDM system is analogous to that of burst errors in a single-carrier system. Hence, tone interleaving mitigates the impact of narrow-band interferer.

The present invention is not so limited however; and it shall be understood that the symbol interleaving and tone interleaving operations can be implemented with a single stage interleaving operation using a composite interleaver.

Mathematical Description

A mathematic description of the symbol interleaving and tone interleaving operations are described herein below. For the sake of simplicity, a block interleaver structure has been considered for both the symbol and tone interleaver. Other interleaver structures such as random interleavers, random block interleavers, or triangular interleavers, can just as easily be chosen however, without loss of generality. Consider for example, a symbol interleaving operation among at most three consecutive OFDM symbols. This corresponds to a maximum interleaving latency of slightly less than 1 µs for a multi-band OFDM system with a symbol duration of $T_{SYMB}=312.5$ ns.

Let $N_{CBPS}$, for example, now be the number of coded bits per OFDM symbol. First, the coded bits are grouped together into blocks of $3N_{CBPS}$ coded bits, which corresponds to three OFDM symbols. Each group of coded bits is then permuted using a regular symbol block interleaver of size $N_{CBPS} \times 3$. Now let the sequences $\{U(i)\}$ and $\{S(j)\}$, where $i, j=0, \ldots, 3N_{CBPS}-1$, represent the input and output bits of the symbol block interleaver, respectively. The input-output relationship of this interleaver is then given by:

$$S(j) = U\left\{Floor\left(\frac{i}{N_{CBPS}}\right) + 3Mod(i, N_{CBPS})\right\},$$

where the function Floor(•) returns the largest integer value less than or equal to its argument value and where the function Mod(•) returns the remainder after division of $N_{CBPS}$ by i. If the coded bits available at the input of the symbol block interleaver correspond to less than three OFDM symbols, then the symbol interleaving operation is not performed on these bits. This condition is expected to occur towards the end of the packet, when the number of coded bits available to the symbol block interleaver only corresponds to that of 1 or 2 OFDM symbols.

'Pad bits' can be used to increase the number of bits to correspond to $XN_{CBPS}$ when the number of bits is less than $XN_{CBPS}$. The 'pad bits' can be added either at the input of the scrambler 102, as a parallel stream 112 to the input data, or at the input of the interleaver 106, as a parallel stream 114 to the interleaver input data. Theoretically, the pad bits can be any random binary sequence. Using a random binary sequence is desirable, especially when the pad bits are introduced at the input of the interleaver 106. If, however, the pad bits are introduced at the input of the scrambler 102, an 'all zero' sequence or an 'all one' sequence is sufficient. The foregoing process is easily implemented; and the scrambler 102 would randomize these bits such that the pad bits at the output of the scrambler 102 correspond to a random binary sequence.

The output of the symbol block interleaver is then passed through a tone block interleaver. In a multi-band OFDM system, the number of coded bits per symbol ($N_{CBPS}$) can take a value of 50, 100 or 200 depending on the information data rate. The outputs of the symbol block interleaver in a typical example are grouped together into blocks of $N_{CBPS}$ bits and then permuted using a regular block interleaver of size $N_{Tint} \times 10$, where $N_{Tint}=N_{CBPS}/10$. Now, let the sequences $\{S(i)\}$ and $\{V(j)\}$, where $i, j=0, \ldots, N_{CBPS}-1$, represent the input and output bits of the tone interleaver, respectively. The input-output relationship of the tone block interleaver is then given by:

$$T(j) = S\left\{Floor\left(\frac{i}{N_{Tint}}\right) + 10Mod(i, N_{Tint})\right\},$$

where the function Mod(•) returns the remainder after division of $N_{Tint}$ by i.

Figure 4A:
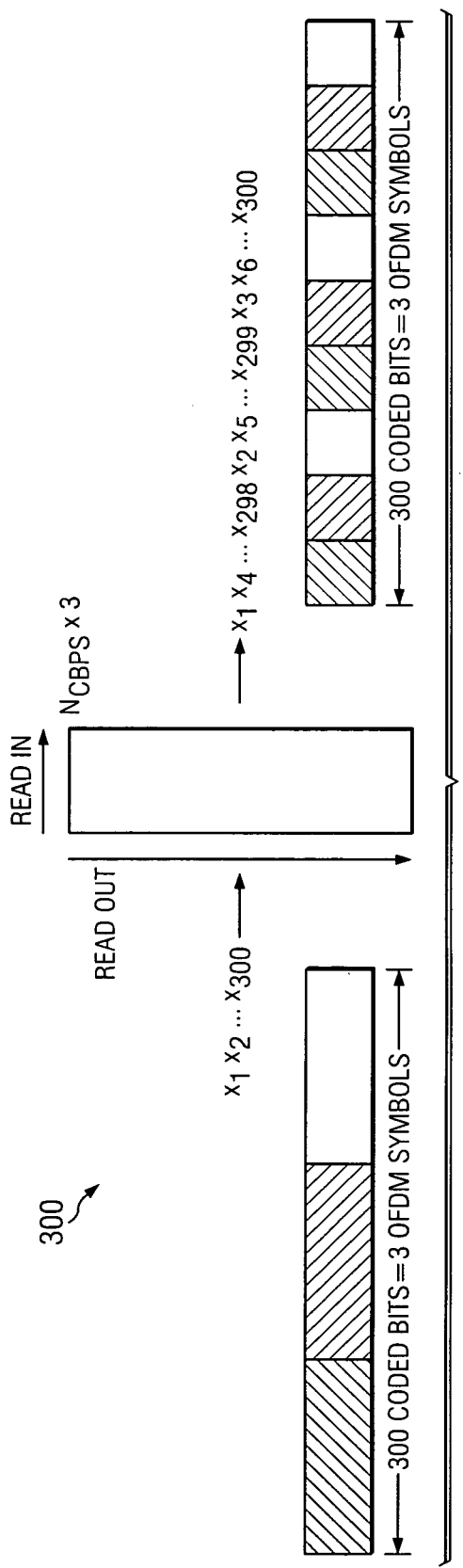
FIGS. 4A and 4B illustrate symbol and tone interleaving processes implemented to generate coded bits that are interleaved across three symbols and within each symbol according to one embodiment of the present invention.
Figure 4B:
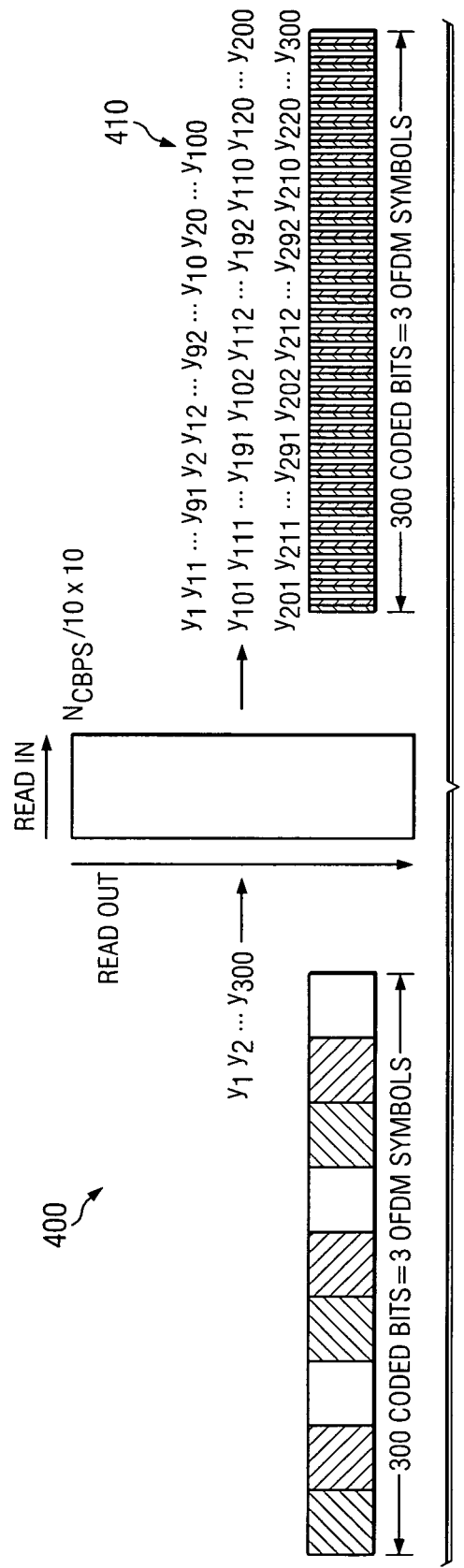

Moving now to FIG. 3, one embodiment of a bit interleaving process 200 using the principles disclosed herein above is discussed in further detail herein below and can be seen to be implemented in three stages:

In the first stage 202, the coded bits, in the header or payload 203, that enter the scrambler 102 seen in FIG. 2, are grouped together into groups of $XN_{CBPS}$ bits 204. These groups of $XN_{CBPS}$ bits 204 are then passed through the convolutional encoder 104 and puncturer 116. After leaving the puncturer 116, each group of $XN_{CBPS}$ bits 204 is interleaved in the second stage 205 using a block symbol interleaver 206. One embodiment of such a symbol interleaver is shown in FIG. 4A that depicts a $XN_{CBPS} \times 3$ block symbol interleaving process 300 for a data rate of 110 Mbps. Subsequent to the symbol interleaving process 300, the resultant bits generated via the symbol interleaving process 300 are interleaved in the third stage 207 using a block tone interleaver 208. One embodiment of such a tone interleaver is shown in FIG. 4B that depicts a $(N_{CBPS}/10) \times 10$ block tone interleaving process 400 for a data rate of 110 Mbps. The end results seen in FIG. 4B depict coded bits 410 that are interleaved across three symbols and within each symbol.

Figure 3:
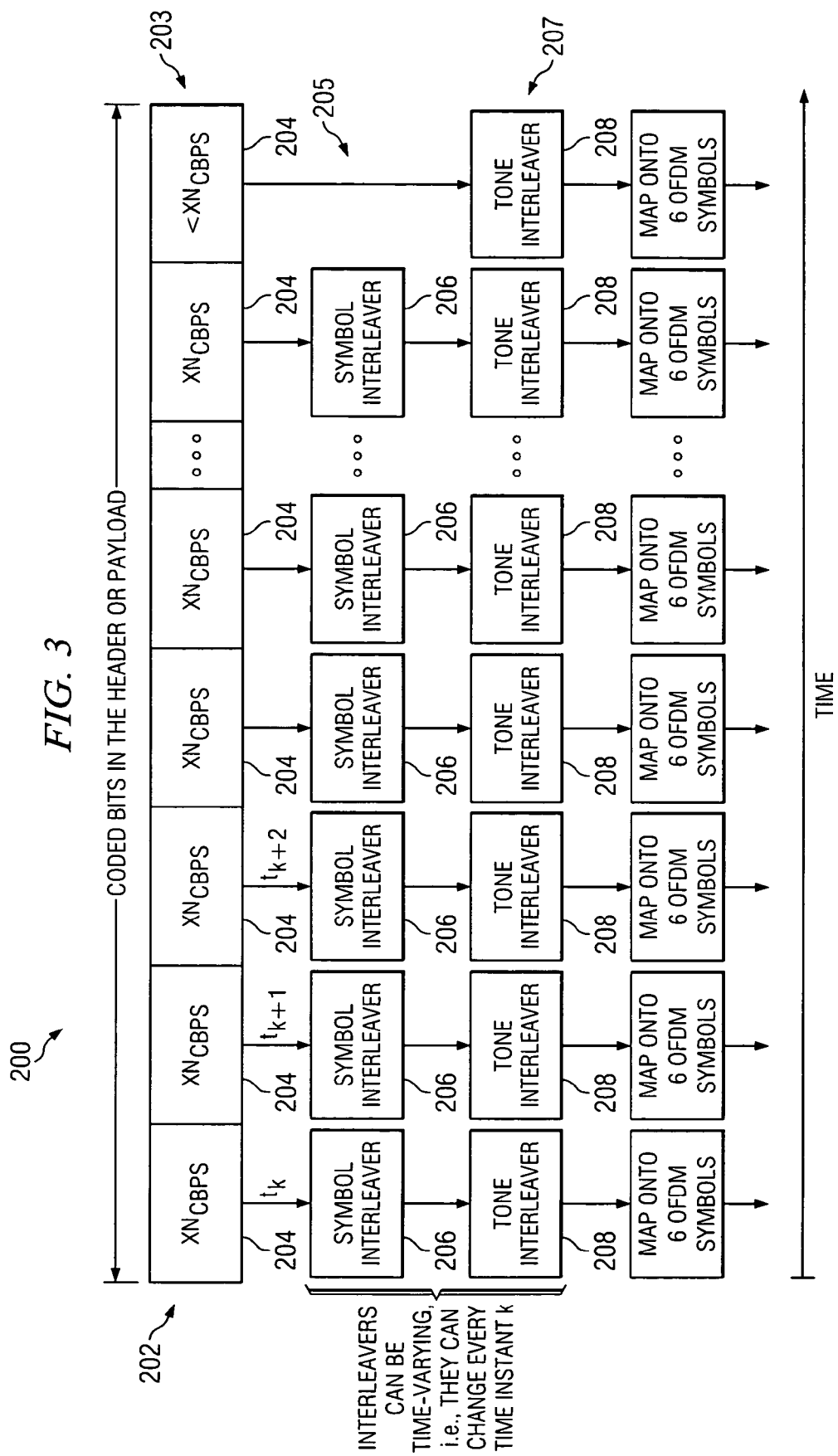
FIG. 3 is a block diagram depicting a bit interleaving process according to one embodiment of the present invention.

If there are less than $XN_{CBPS}$ bits, depicted as $<XN_{CBPS}$ 210 in FIG. 3, which can happen at the end of the header 203 or near the end of a packet, then the second stage 205 of the bit interleaving process 200 is skipped. Pad bits 112, 114 can however, be added as discussed herein before, as an input to the scrambler 102 or alternatively as an input to the interleaver 106. If the pad bits 112 are input to the scrambler 102, then every group of coded bits in the header or payload will be an integral multiple $XN_{CBPS}$, and $<XN_{CBPS}$ 210 will never exist. In this instance, the second stage 205 will always be present. The pad bits 114 can also be input to the interleaver 106. In this way, coded bits $<XN_{CBPS}$ 210 are increased until they equal $XN_{CBPS}$ bits, and the second stage of bit interleaving 205 can again be implemented prior to tone interleaving.

The symbol and tone interleavers 205, 207, as stated herein before, can be time-varying, i.e., they can change at every time instant k. Thus, at one time instant k1, for example, a first combination of random interleavers, random block interleavers, or triangular interleavers may be employed to implement the symbol and/or tone interleavers 205, 207, while at a different time instant k2, a second combination of random interleavers, random block interleavers, or triangular interleavers may be employed to implement the symbol and/or tone interleavers 205, 207. The present invention is not so limited however, and although specific types of interleavers have been discussed herein before, those skilled in the art will readily appreciate that other interleaver types and combinations can just as easily be employed to implement a bit interleaver in accordance with the inventive principles set forth herein above.

This invention has been described in considerable detail in order to provide those skilled in the multi-band OFDM art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A bit interleaving method comprising the steps of:
   grouping the coded bits of an OFDM symbol stream into blocks of $XN_{CBPS}$, wherein X is a desired number of OFDM symbols and further wherein $N_{CBPS}$ is the number of coded bits per symbol;
   permuting each group of coded bits and generating interleaved OFDM symbols in response thereto only if the coded bits available for grouping correspond to no less than X OFDM symbols;
   grouping the interleaved OFDM symbols into blocks of $N_{CBPS}$ bits; and
   permuting each block of $N_{CBPS}$ bits associated with the interleaved OFDM symbols and generating interleaved OFDM tones in response thereto.

2. The bit interleaving method according to claim 1, wherein X=6.

3. The bit interleaving method according to claim 1, wherein the step of permuting each group of coded bits and generating interleaved OFDM symbols in response thereto is implemented via a symbol interleaving operation having an input-output relationship defined by $$S(j) = U\left\{Floor\left(\frac{i}{N_{CBPS}}\right) + X Mod(i, N_{CBPS})\right\},$$

wherein $\{U(i)\}$ and $\{S(j)\}$, where i, j=0, . . . ,$XN_{CBPS}$, represent the input and output bits of the symbol interleaving operation respectively, and further wherein the function Floor(.) returns the largest integer value less than or equal to its argument value, and further wherein the function Mod(•) returns the remainder after division of $NC_{CBPS}$ by i.

4. The bit interleaving method according to claim 3, wherein X=6.

5. The bit interleaving method according to claim 1, wherein the step of permuting each block of $N_{CBPS}$ its associated with the interleaved OFDM symbols and generating interleaved OFDM tones in response thereto comprises permuting each block of $N_{CBPS}$ bits via a tone interleaving operation of size $N_{Tint} \times A$, wherein $N_{Tint} = N_{CBPS}/A$, and further wherein A is a desired integer value.

6. The bit interleaving method according to claim 5, wherein A=10.

7. The bit interleaving method according to claim 5, wherein A=10 and X=6.

8. The bit interleaving method according to claim 5, wherein the tone interleaving operation has an input-output relationship defined by $$T(j) = S\left\{Floor\left(\frac{i}{N_{Tint}}\right) + A Mod(i, N_{Tint})\right\},$$

wherein $\{S(i)\}$ and $\{T(j)\}$, where i, j=0, . . . , $N_{CBPS}$ −1 represent the input and output bits of the tone interleaving operation respectively, and further wherein the function Floor(•) returns the largest integer value no greater than it argument value, and further wherein the function Mod(•) returns the remainder after division of $N_{Tint}$ by i.

9. The bit interleaving method according to claim 8, wherein A=10.

10. The bit interleaving method according to claim 8, wherein A=10 and X=6.

11. The bit interleaving method according to claim 1, wherein the steps of generating interleaved OFDM symbols and generating interleaved OFDM tones are implemented via a single stage composite interleaving operation.

12. A bit interleaving method comprising the steps of:
   grouping the coded bits of an OFDM symbol stream into blocks of $XN_{CBPS}$, wherein X is a desired number of OFDM symbols and further wherein $N_{CBPS}$ the number of coded bits per symbol, and further wherein pad bits are added to increase the number of bits to correspond to $XN_{CBPS}$, whenever the number of coded bits per symbol is less than $N_{CBPS}$;
   permuting each group of coded bits and generating interleaved OFDM symbols in response thereto;

grouping the interleaved OFDM symbols into blocks of $N_{CBPS}$ bits; and permuting each block of $N_{CBPS}$ its associated with the interleaved OFDM symbols and generating interleaved OFDM tones in response thereto.

13. The bit interleaving method according to claim 12, wherein X=6.

14. The bit interleaving method according to claim 12, wherein the step of permuting each group of coded bits and generating interleaved OFDM symbols in response thereto is implemented via a symbol interleaving operation having an input-output relationship defined by $$S(j) = U\left\{Floor\left(\frac{i}{N_{CBPS}}\right) + X Mod(i, N_{CBPS})\right\},$$

wherein $\{S(i)\}$ and $\{T(j)\}$, where i, j=0, . . . , $XN_{CBPS}$, represent the input and output bits of the symbol interleaving operation respectively, and further wherein the function Floor(•) returns the largest integer value less than or equal to its argument value, and further wherein the function Mod(•) returns the remainder after division of $N_{CBPS}$ by i.

15. The bit interleaving method according to claim 14, wherein X=6.

16. The bit interleaving method according to claim 12, wherein the step of permuting each block of $N_{CBPS}$ bits associated with the interleaved OFDM symbols and generating interleaved OFDM tones in response thereto comprises permuting each block of $N_{CBPS}$ bits via a tone interleaving operation of size $N_{Tint} \times A$, wherein $N_{Tint}$=t $N_{CBPS}/A$, and further wherein A is a desired integer value.

17. The bit interleaving method according to claim 16, wherein A=10.

18. The bit interleaving method according to claim 16, wherein A=10 and X=6.

19. The bit interleaving method according to claim 16, wherein the tone interleaving operation has an input-output relationship defined by $$T(j) = S\left\{Floor\left(\frac{i}{N_{Tint}}\right) + A Mod(i, N_{Tint})\right\},$$

wherein $\{S(i)\}$ and $\{T(j)\}$, where i, j=0, . . . , $N_{CBPS}$ −1 represent the input and output bits of the tone interleaving operation respectively, and further wherein the function Floor(•) returns the largest integer value no greater than it argument value, and further wherein the function Mod(•) returns the remainder after division of NTint by i.

20. The bit interleaving method according to claim 19, wherein A=10.

21. The bit interleaving method according to claim 19, wherein X=6.

22. The bit interleaving method according to claim 19, wherein A=10 and X=6.

23. The bit interleaving method according to claim 12, wherein the steps of generating interleaved OFDM symbols and generating interleaved OFDM tones are implemented via a single stage composite interleaving operation.

24. A bit interleaver comprising:

a symbol interleaver operational to group the coded bits of a an OFDM symbol stream into blocks of $XN_{CBPS}$ coded bits, wherein X is the desired number of OFDM symbols and further wherein $N_{CBPS}$ is the number of coded bits per symbol, and further operational to permute each group of coded bits and generate interleaved OFDM symbols in response thereto only if the coded bits available for grouping correspond to no less than X OFDM symbols; and a tone interleaver operational to group the interleaved OFDM symbols into blocks of $N_{CBPS}$ bits and permute each block of $N_{CBPS}$ bits associated with the interleaved OFDM symbols and generate interleaved OFDM tones in response thereto.

25. The bit interleaver according to claim 24, wherein X=6.

26. The bit interleaver according to claim 24, wherein the symbol interleaver is configured to have an input-output relationship defined by $$S(j) = U\left\{Floor\left(\frac{i}{N_{CBPS}}\right) + X Mod(i, N_{CBPS})\right\},$$

wherein $\{S(i)\}$ and $\{T(j)\}$, where i, j=0, . . . , $XN_{CBPS}$ −1, represent the input and output bits of the symbol interleaver respectively, and further wherein the function Floor(•) returns the largest integer value less than or equal to its argument value, and further wherein the function Mod(•) returns the remainder after division of $N_{CBPS}$ by i.

27. The bit interleaver according to claim 26, wherein X=6.

28. The bit interleaver according to claim 24, wherein the tone interleaver is configured to have an input-output relationship defined by $$T(j) = S\left\{Floor\left(\frac{i}{N_{Tint}}\right) + A Mod(i, N_{Tint})\right\},$$

wherein $\{S(i)\}$ and $\{T(j)\}$, where i, j=0, . . . , $N_{CBPS}$ −1 represent the input and output bits of the tone interleaver respectively, and further wherein the tone interleaver size=$N_{Tint} \times A$, $N_{Tint} = N_{CBPS}/A$ and A is a desired integer value, and further wherein the function Floor(•) returns the largest integer value no greater than it argument value, and fiu-ther wherein the function Mod(•) returns the remainder after division of $N_{Tint}$ By i.

29. The bit interleaver according to claim 28, wherein A=10.

30. The bit interleaver according to claim 28, wherein X=6.

31. The bit interleaver according to claim 28, wherein A=10 and X=6.

32. A composite bit interleaver operational to group the coded bits of an OFDM symbol stream into blocks of $XN_{CBPS}$ coded bits, wherein X is the desired number of OFDM symbols and further wherein $N_{CBPS}$ is the number of coded bits per symbol, and further operational to permute each group of coded bits and generate interleaved OFDM symbols in response thereto only if the coded bits available for grouping correspond to no less than X OFDM symbols; and further operational to group the interleaved OFDM symbols into blocks of $N_{CBPS}$ its and permute each block of $N_{CBPS}$ bits associated with the interleaved OFDM symbols and generate interleaved OFDM tones in response thereto.

33. The composite bit interleaver according to claim 32, wherein X=6.

34. The composite bit interleaver according to claim 32, wherein the symbol interleaving operation is defined via an input-output relationship according to $$S(j) = U\left\{Floor\left(\frac{i}{N_{CBPS}}\right) + XMod(i, N_{CBPS})\right\},$$

wherein {S(i)} and {T(j)}, where i, j=0, . . . , $XN_{CBPS}$ −1, represent the input and output bits of the symbol interleaving operation respectively, and further wherein the function Floor(•) returns the largest integer value less than or equal to its argument value, and further wherein the function Mod(•) returns the remainder after division of $N_{CBPS}$ by i.

35. The composite bit interleaver according to claim 34, wherein X=6.

36. The composite bit interleaver according to claim 32, wherein the tone interleaving operation is defined via an input-output relationship according to $$T(j) = S\left\{Floor\left(\frac{i}{N_{Tint}}\right) + AMod(i, N_{Tint})\right\},$$

wherein {S(i)} and {T(j)}, where i, j=0, . . . , $N_{CBPS}$ −1 represent the input and output bits of the tone interleaving operation respectively, and further wherein the tone interleaver size=$N_{Tint}$×A, $N_{Tint}$=$N_{CBPS}$/A and A is a desired integer value, and further wherein the function Floor(•) returns the largest integer value no greater than it argument value, and further wherein the function Mod(•) returns the remainder after division of $N_{Tint}$ by i.

37. The composite bit interleaver according to claim 36, wherein A=10.

38. The composite bit interleaver according to claim 36, wherein X=6.

39. The composite bit interleaver according to claim 36, wherein A=10 and X=6.

40. A composite bit interleaver operational to group the coded bits of an OFDM symbol stream into blocks of X $N_{CBPS}$ coded bits, wherein X is the desired number of OFDM symbols, $N_{CBPS}$ is the number of coded bits per symbol, and pad bits are used to increase the number of bits to correspond to X OFDM symbols whenever the number of coded bits per symbol is less than $N_{CBPS}$, and to permute each group of coded bits and generate interleaved OFDM symbols in response thereto; and further operational to group the interleaved OFDM symbols into blocks of $N_{CBPS}$ bits and permute each block of $N_{CBPS}$ bits associated with the interleaved OFDM symbols and generate interleaved OFDM tones in response thereto.

41. The composite bit interleaver according to claim 40, wherein X=6.

42. The composite bit interleaver according to claim 40, wherein the symbol interleaving operation is defined via an input-output relationship according to $$S(j) = U\left\{Floor\left(\frac{i}{N_{CBPS}}\right) + XMod(i, N_{CBPS})\right\},$$

wherein {S(i)} and {T(j)}, where i, j=0, . . . , $XN_{CBPS}$ −1, represent the input and output bits of the symbol interleaving operation respectively, and further wherein the function Floor(•) returns the largest integer value less than or equal to its argument value, and further wherein the function Mod(•) returns the remainder after division of $N_{CBPS}$ by i.

43. The composite bit interleaver according to claim 42, wherein X=6.

44. The composite bit interleaver according to claim 40, wherein the tone interleaving operation is defined via an input-output relationship according to $$T(j) = S\left\{Floor\left(\frac{i}{N_{Tint}}\right) + AMod(i, N_{Tint})\right\},$$

wherein {S(i)} and {T(j)}, where i, j=0, . . . , $N_{CBPS}$ −1 represent the input and output bits of the tone interleaving operation respectively, and further wherein the tone interleaver size=$N_{Tint}$×A, $N_{Tint}$=$N_{csps}$/A and A is a desired integer value, and further wherein the function Floor(•) returns the largest integer value no greater than it argument value, and further wherein the function Mod(•) returns the remainder after division of $N_{Tint}$ by i.

45. The composite bit interleaver according to claim 44, wherein A=10.

46. The composite bit interleaver according to claim 44, wherein X=6.

47. The composite bit interleaver according to claim 44, wherein A=10 and X=6.

* * * * *